United States Patent
Kidambi

(10) Patent No.: US 8,427,175 B2
(45) Date of Patent: Apr. 23, 2013

(54) CORRECTION OF NON-LINEARITIES IN ADCS

(75) Inventor: Sunder S. Kidambi, Austin, TX (US)

(73) Assignee: Intersil Americas Inc., Milpitas, CA (US)

( * ) Notice: Subject to any disclaimer, the term of this patent is extended or adjusted under 35 U.S.C. 154(b) by 366 days.

(21) Appl. No.: 12/874,654

(22) Filed: Sep. 2, 2010

(65) Prior Publication Data
US 2011/0199096 A1 Aug. 18, 2011

Related U.S. Application Data

(60) Provisional application No. 61/305,609, filed on Feb. 18, 2010.

(51) Int. Cl.
*G01R 35/00* (2006.01)
*G01R 23/00* (2006.01)

(52) U.S. Cl.
USPC .................................. 324/601; 324/76.19

(58) Field of Classification Search .................. 324/601, 324/76.19
See application file for complete search history.

(56) References Cited

U.S. PATENT DOCUMENTS

| | | | |
|---|---|---|---|
| 5,594,612 A * | 1/1997 | Henrion | 341/120 |
| 6,445,317 B2 * | 9/2002 | Lundin et al. | 341/120 |
| 7,336,729 B2 | 2/2008 | Agazzi | |
| 7,501,967 B2 | 3/2009 | Drazelmayr et al. | |
| 7,551,114 B2 | 6/2009 | Joy et al. | |
| 7,693,214 B2 | 4/2010 | Shida | |
| 7,839,323 B2 | 11/2010 | Kidambi | |
| 2003/0028334 A1 * | 2/2003 | Ghaoud et al. | 702/45 |

* cited by examiner

*Primary Examiner* — Amy He
(74) *Attorney, Agent, or Firm* — Cesari and McKenna, LLP

(57) ABSTRACT

Techniques for calibrating non-linearities of ADCs are described, which can be applied whether or not the non-linearities change with frequency. When the non-linearities do not change (are static), the frequency of a calibrating signal is first estimated coarsely in a calibration mode, then a fine estimate is determined using the coarse estimate. These estimates are then used to predict the sinusoidal signal using a linear predictor. A Look Up Table (LUT) containing corrections to the ADC is derived from this result. The LUT is then used in a normal operating mode to correct the output of the ADC. In a case where the characteristics of the non-linearities of the input signal are dynamic and thus change with frequency, a frequency spectrum of interest is broken into several regions. In each of these regions, a frequency is identified and used as a calibrating signal to generate the corresponding LUT. During normal operation of the ADC, in a first method, the bin corresponding to dominant frequency of the signal is identified using a short-length FFT. This bin is used to select the appropriate LUT for operating on the output of the ADC to provide the calibrated output. In a second method used when dynamic input is expected, a single LUT is developed using the averages values from the LUTs determined from the various regions.

16 Claims, 20 Drawing Sheets

CORRECTION OF NON-LINEARITIES IN ADCS

CROSS REFERENCE TO RELATED APPLICATIONS

This application claims the benefit of (a) U.S. Provisional Application No. 61/305,609 filed on Feb. 18, 2010, the entire contents of which are incorporated by reference herein in their entirety.

BACKGROUND

It is well-known that practical Analog to Digital Converters (ADCs) suffer from various errors, for example, offset, gain and linearity errors. These errors stem from various sources, such as non-ideal spacing of transistor levels and timing jitter, just to name a few. These errors contribute significantly to the deterioration of the broadband performance of the ADC. Even with superior design of the individual analog components of the ADC, it may still not be possible to achieve the desired performance. In such cases, digital post-processing can be utilized to provide the extra improvement is needed to achieve the performance goal.

In one approach employed in the prior art, the ADC is operated in a calibration mode with a calibrating signal such as a sinusoid applied to the input. An estimate of the frequency, $\hat{\omega}$, of the input calibrating signal is determined as $$\hat{\omega} = \arg\max_{\omega \in (0,\pi)} |x(k)e^{j\omega k}| \quad (1)$$

where x(k) are the output samples from the ADC. The maximization of the above equation can be performed iteratively using a Fast Fourier Transform (FFT).

It is also known how to perform linear prediction of sinusoidal signals in a more general sense (not necessarily in the context of calibrating ADCs), given a set of current signal samples and past samples. This typically involves the calculation of coefficients which are very compute-intensive. These are given by $$s'(k) = \sum_{l=0}^{L} c(l)x(k-l) \quad (2)$$

where, s'(k) is the estimate of the current sample, x(k−l) are the past output samples from the ADC, and L is the length of the filter. The coefficients c(l) of the prediction filter are given by $$c(l) = \frac{(L+1)\cos(l\omega) + (S_s - S_c)\cos((l+2)\omega) - 2S_{sc}\sin((l+2)\omega)}{2(S_c S_s - S_{sc}^2)} \quad (3)$$

where $$S_c = \sum_{l=1}^{L+1} \cos^2(l\omega)$$

$$S_s = \sum_{l=1}^{L+1} \sin^2(l\omega)$$

$$S_{sc} = \sum_{l=1}^{L+1} \sin(l\omega)\cos(l\omega)$$

SUMMARY OF THE INVENTION

In a preferred embodiment, a method and/or apparatus can be used to correct non-linearities of an Analog to Digital Converter (ADC) based on a frequency estimation and signal prediction technique. The method entails one or more of the following steps as explained below.

A first case is when the non-linearities are static, i.e., where the characteristics of the non-linearities can be assumed to not change with frequency.

In this Static Correction Method:

1. A relatively low-frequency signal from a signal generator that activates most levels of the ADC under test is input to the ADC.
2. A coarse estimate of the frequency of the signal is obtained using a zero-crossing technique.
3. Next, a fine frequency estimate is obtained using an adaptive notch filter technique.
4. After the fine frequency is estimated, the signal is predicted using a sinusoid-prediction technique.
5. Entries of a Look-up table (LUT) are generated based on mean-square error criterion that provides optimal quantization levels to the input signal.
6. Once the LUT is generated, the output of the ADC is passed as an address to the LUT and the corresponding output from the LUT is the compensated value in a mean-square sense.

A second case is when the non-linearites are dynamic, i.e., where the characteristics of the non-linearities are expected to change with frequency. Dynamic correction of the ADC can be carried for this case out using two different methods that build on the static method above.

In a First Dynamic Correction Method:

1. The usable frequency spectrum of the ADC can be divided into various regions where the non-linear characteristics change considerably. For each of these regions, a center frequency, for example, can be chosen as the calibration frequency. Such frequencies can be found during the simulation phase of the design.
2. Follow the procedure outlined above for the static characteristics and obtain an LUT for each of these frequencies.
3. By estimating the dominant frequency in the signal, the appropriate LUT can be used for correction.

In a Second Dynamic Correction Method:

Alternatively, if the non-linear characteristics do not deviate much from one another, 1. The LUT entries for different calibration frequencies are determined as in steps 1 and 2 of the First Dynamic Correction Method.
2. Average values for each entry in the multiple LUTs are stored in a single LUT.
3. The single LUT is then used for correction regardless of input signal frequency.

The methods described above can be implemented in software, firmware, hardware, or any combination thereof. For example in one embodiment, the methods are implemented in software, as a stored program containing instructions executed by one or more digital signal processors. Such processors generally include storage devices such as memory for storing data and programs, and input/output (I/O) devices for receiving input signals and providing output signals. As is well known, such processors operate by retrieving a stored program from a computer readable storage medium, storing the program in one or more active memory devices and then executing the instructions to operate on input signals or data and product output signals or data. The methods may also be carried out by more general purpose computers.

While the correction techniques briefly described above were indicated as being implemented as methods, it also should be understood a hardware apparatus can also implement the invention using any of the following technologies, or a combination thereof: discrete logic circuit(s) that including logic gates and/or transistor circuits for implementing logic functions upon input digital signals, an application specific integrated circuit (ASIC) having appropriate combinatorial logic gates, programmable gate array(s) (PGAs), field programmable gate arrays (FPGAs) and so forth.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF PREFERRED EMBODIMENTS

A description of example embodiments of the invention follows.

Figure 1:
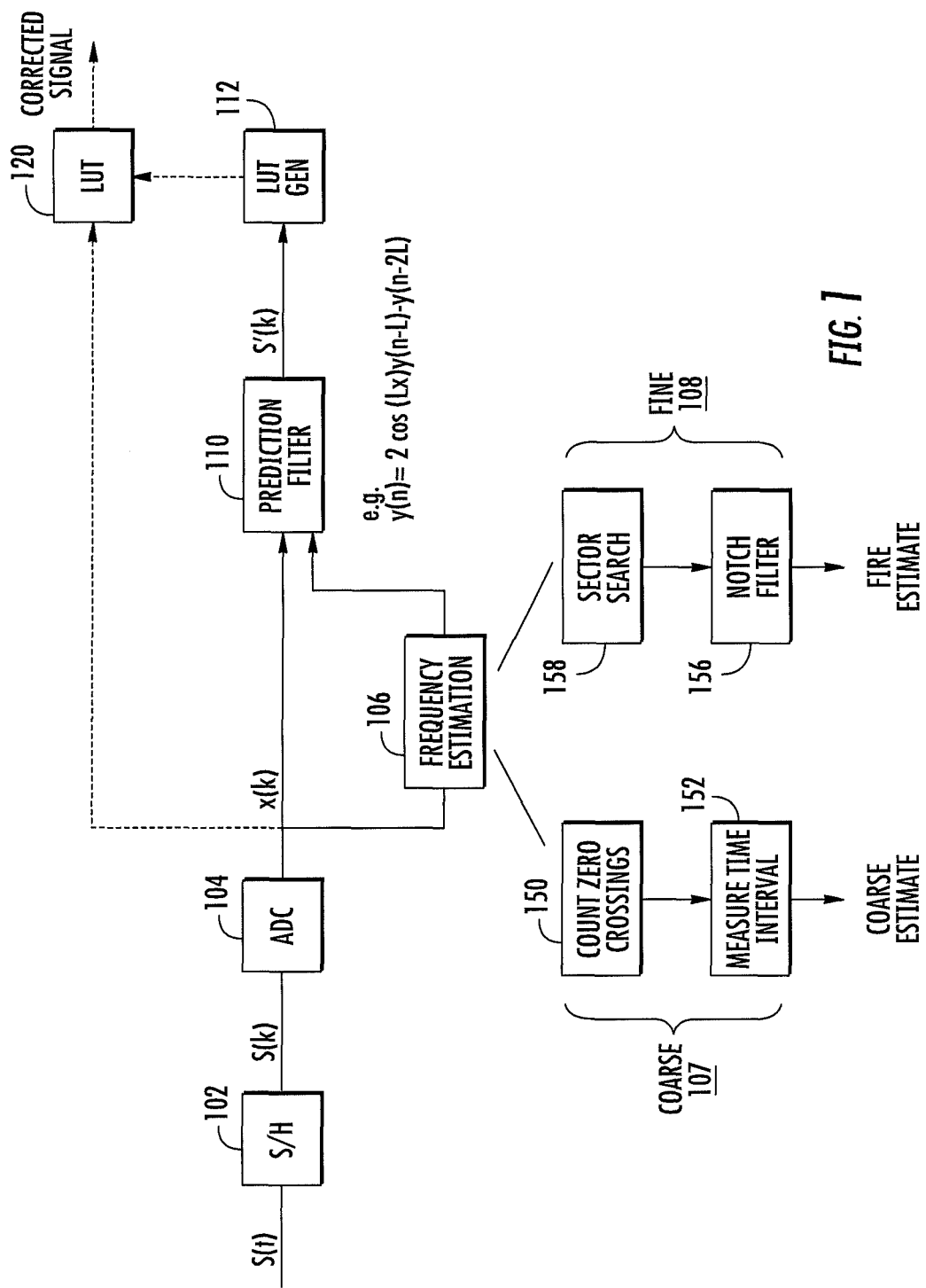
FIG. 1 illustrates a model of the calibration scheme.

A high level model of a preferred embodiment of the calibration scheme 100 is shown in FIG. 1. The method is to first apply a test signal s(t) to a sample and hold (S/H) 102 to produce a discrete time sampled signal s(k) which then feeds the Analog to Digital Converter (ADC) 104 to be calibrated.

A frequency estimation block 106 first estimates the frequency of the test signal s(t) using a two part process, viz., including coarse estimation 107 and fine estimation 108.

The coarse estimate 107 is found by using a zero-crossing counting technique 150 which can use a counter, an adder, and a divider. Linear interpolation 152 over a measured time interval is used to determine the zero-crossing instants and hence the frequency. Moreover, only the instants where the signal goes from a negative value to a positive value (or other way around) are calculated. Hence the operations can be pipelined too.

The fine frequency estimate 108 is performed using a notch filter 158 wherein the notch frequency is searched 156 within a small region of frequencies near the coarse estimate frequency. Any suitable line-search method can be used for this purpose. The notch filter can comprise two multipliers, two delay elements and seven adders. Of the multipliers, one of them is represented as a shift-and-add operation.

A linear prediction filter 110 then determines the coefficients of a sinusoid from the fine estimate. The prediction filter can be implemented in a simple manner, such as by using only shift-and-add operations. The linear predictor filter 110 can be obtained based on predicting a sinusoid from past samples. This gives an averaging effect to the prediction of the present sample.

The predicted sinusoid s'(k) is then used by a LUT generation process 112 to determine the entries of a Look Up Table (LUT) 120.

In operation, the output of the ADC 104 is then fed to the LUT 120 for correction (indicated in FIG. 1 by the dashed line connections).

A more detailed discussion of each of these elements now follows.

Correction of Static Non-Linearities

It is fair to assume that the offset error in the ADC 104 can be corrected using the mean value of the output of the ADC 104. Consequently, assume s(k) is a signal of the form $$s(k) = A\sin\left(2\pi k \frac{F_{in}}{F_s} + \phi\right) \qquad (4)$$

where s(k) is the sampled version of the continuous-time input signal s(t), A is the amplitude of the input signal, k is the sample instant, $F_{in}$ and $F_s$ are the input and sampling frequencies, and $\phi$ is any arbitrary phase. An N-bit ADC 104 takes the sampled signal s(k) and produces a quantized value, viz., x(k)=Q[s(k)], where Q denotes the quantization. Looking at it from a different perspective, the signal s(k) is mapped to a different value x(k) based on the non-linear characteristics of the ADC. Since there are N bits in the ADC, x(k) has M values, where $M=2^N$. By virtue of the finite word-length and non-linearity of the ADC, the value of s(k) is different from x(k). It is, however, assumed that if x(k)∈{$x_0, x_1, \ldots, x_{M-1}$}, then $x_0 < x_1 < x_2 < \ldots < x_{M-1}$.

In the calibration scheme 100, the value of s(k) is predicted based on the past values of the output of the ADC 104, i.e. x(n−k). In other words, s'(k), an estimate of s(k) is obtained and the entries of the LUT 120 are such that the mean-square error between s(k) and s'(k) is minimized.

Frequency Estimation

It is assumed that a signal generator provides a sine wave with a spectral content better than (i.e., less noisy or purer than) the ADC under test. A signal s(t) of the form shown in Eqn. 4. is input to the ADC 104 through the sample-and-hold circuit 102. In order to predict this signal, the frequency $F_{in}$ must be estimated. The frequency estimation block 106 is broken into two parts, viz., a coarse estimate 107 and a fine estimate 108.

In order to make a coarse estimate of the frequency of the input signal, a first step is to calculate the timing of the zero-crossing instants. This can be done by detecting the zero-crossings and counting how many zero-crossings occur in a particular time interval. After $N_z$ number of zero-crossings, we can then obtain the coarse estimate of the frequency from the difference in time of the first and last zero crossings.

Figure 2:
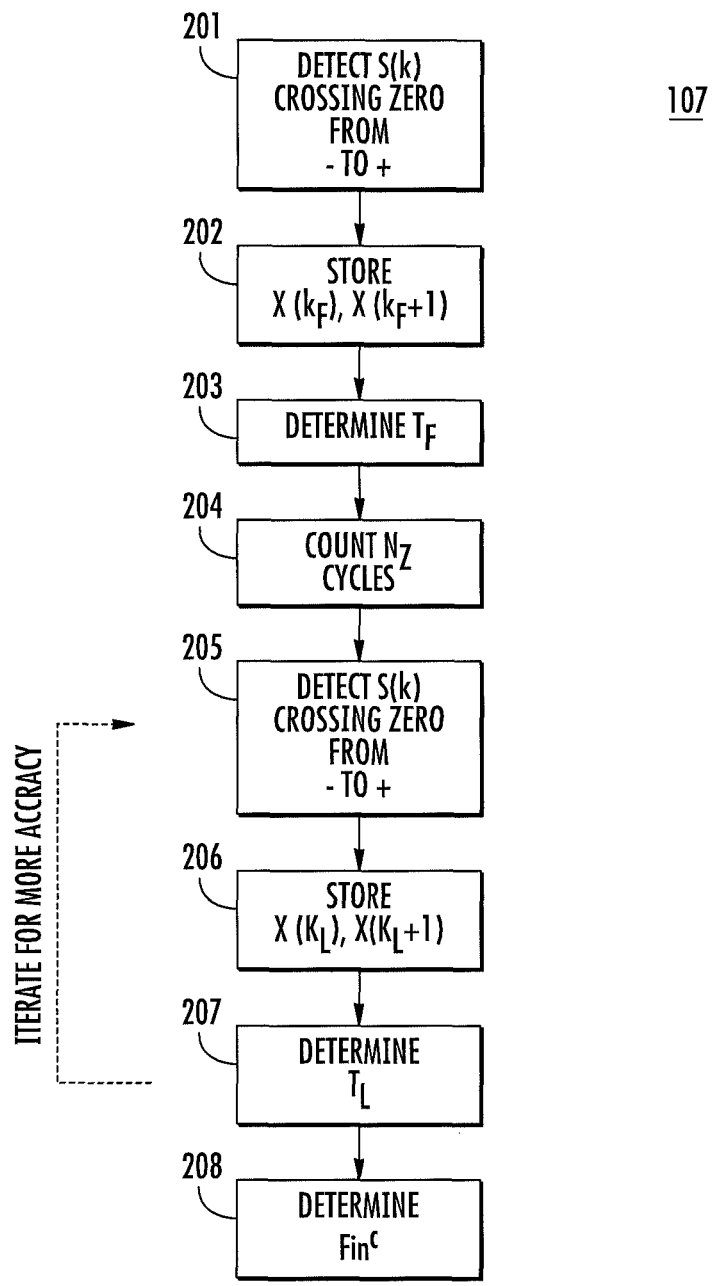
FIG. 2 is a flowchart of steps performed for coarse frequency estimation.

The process is shown in detail in FIG. 2. For example, let $k_F$ and $k_F+1$ denote the sampling instants during which the signal is detected (step 201) crossing a zero from a negative value to a positive value and $x(k_F)$ and $x(k_F+1)$ be the two corresponding values at these time instants, respectively, and store them (step 202). Then determine (step 203)

$$t_F = k_F + \frac{x(k_F)}{x(k_F) - x(k_F + 1)} \quad (5)$$

Similarly, after counting (step 204) $N_z$ cycles let $k_L$ and $k_L+1$ denote the sampling instants during which the signal crosses zero from a negative value to a positive value. If $x(k_L)$ and $x(k_L+1)$ are the two corresponding values stored (step 206) at these time instants, respectively, then determine (step 209)

$$t_L = k_L + \frac{x(k_L)}{x(k_L) - x(k_L + 1)} \quad (6)$$

Thus, a coarse estimate of the input frequency $F_{in}^c$ is given (step 208) by $$F_{in}^c = \frac{N_z}{t_L - t_F} \quad (7)$$

Another way to obtain a slightly better estimate is as follows. Let $t_0, t_1, \ldots, t_{N_z}$ be $N_z+1$ time instants for zero crossing (rather than just two). These time instants can be obtained as shown in Eqn (5) or (6).

The coarse frequency estimate then can be obtained as $$F_{in}^c = \frac{N_z}{\sum_{k=1}^{N_z} t_k - t_{k-1}} \quad (8)$$

The fine frequency estimation 108 is based on an adaptive notch filter technique. Before embarking on the fine frequency estimation, consider the notch filter mechanism. A digital notch filter can be realized as $$G(z) = \frac{1}{2}(1 + A(z)) \quad (9)$$

where A(z) is an all-pass filter. The characteristics of G(z) are such that $$G(e^{j0}) = G(e^{j\pi}) = 1$$

$$G(e^{j\omega_0}) = 0 \quad (10)$$

where $\omega_0$ is the angular notch frequency. A second-order transfer function to effect the all-pass filter is given by $$A(z) = \frac{k_2 + k_1(1 + k_2)z^{-1} + z^{-2}}{1 + k_1(1 + k_2)z^{-1} + k_2 z^{-2}} \quad (11)$$

where $k_1$ and $k_2$ are multipliers defining the notch parameters. It can be shown that this choice of all-pass filter allows the independent tuning of $\omega_0$ and the 3-dB bandwidth according to $$k_1 = -\cos(\omega_0) \quad (12) \& (13)$$

$$k_2 = \frac{1 - \tan(\Omega/2)}{1 + \tan(\Omega/2)}$$

where $\Omega$ is the 3-dB bandwidth. As can be seen from Eqn (13), the bandwidth depends on the value of $k_2$. Thus, by appropriately choosing the value of $k_2$ as a Canonic Signed Digit (CSD) number, the need for a multiplication can be circumvented. For e.g., by choosing $k_2=1-2^{-3}=0.875$, obtain a bandwidth of $\Omega=0.01\pi$.

Figure 3:
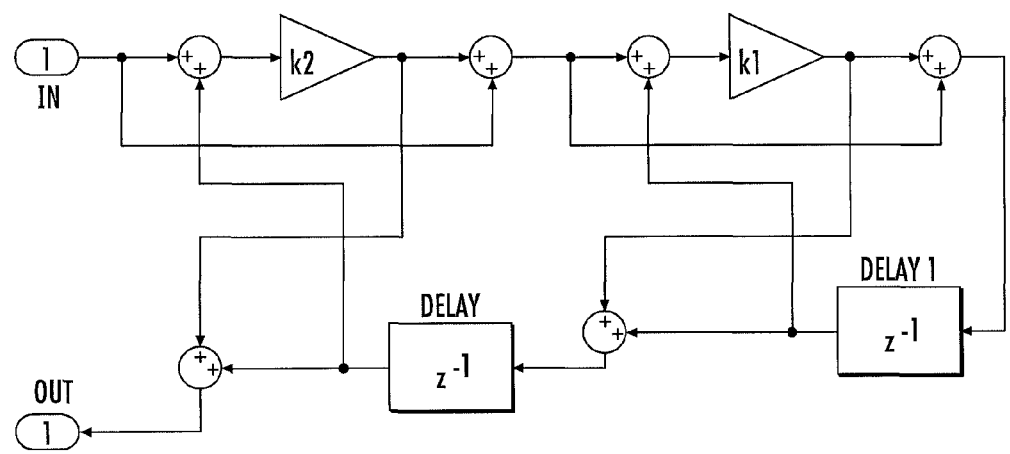
FIG. 3 shows the second order all-pass filter A(z).

A second-order all-pass filter A(z) realized using a cascade of single multiplier lattice two-pair is shown in FIG. 3.

Figure 4:
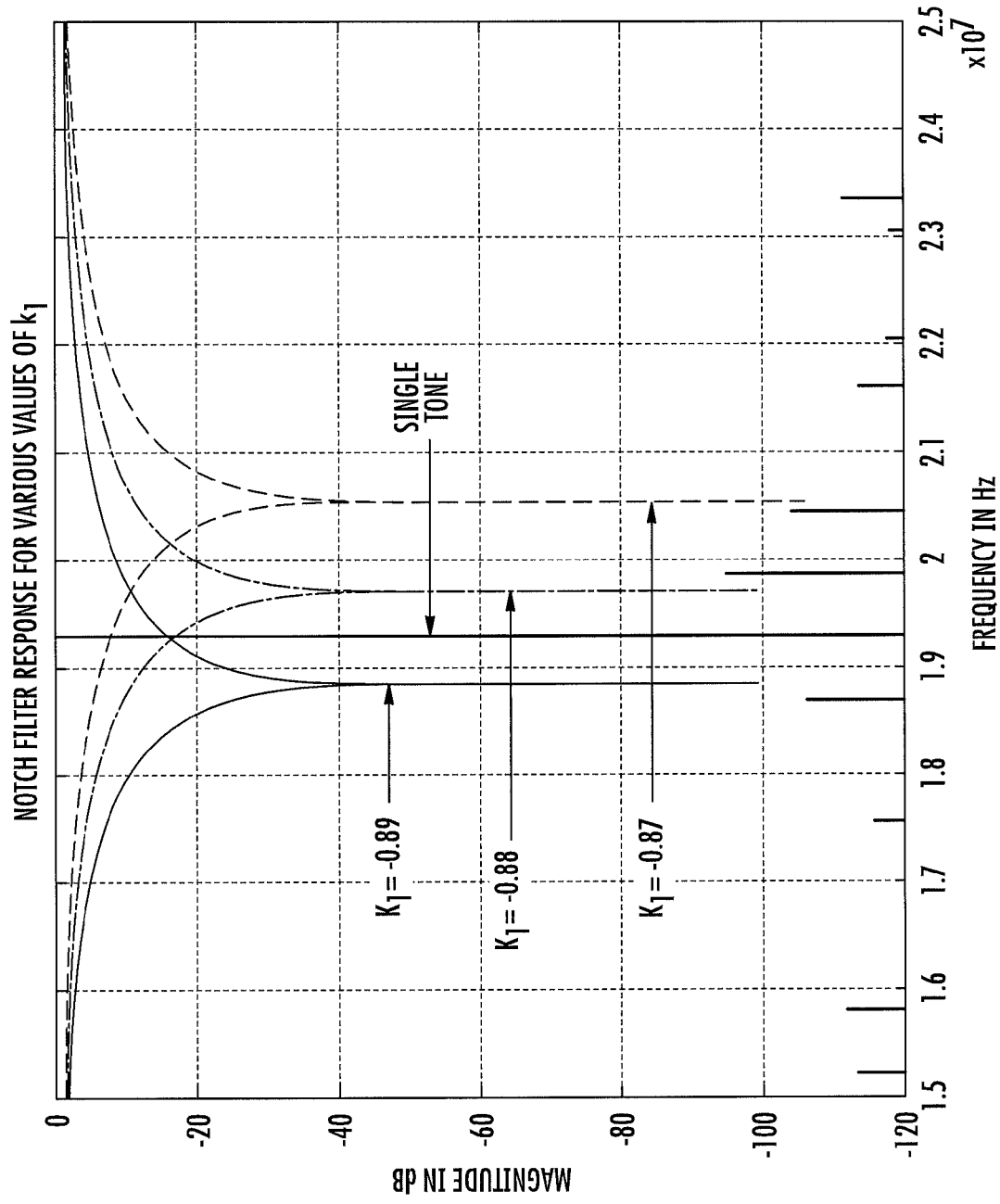
FIG. 4 illustrates the notch filter response for various values of $K_1$.

Towards estimating the fine frequency of the input signal, let us now look at the response of the notch filter for various values of $k_1$, for an example where that sampling rate is 50 MHz. This is shown in FIG. 4. In this is shown a tone at around 19.3 MHz. Thus, by varying the value of $k_1$ around the coarse estimate of the frequency, we can notch out the input tone. This is indicated, theoretically, by zero power or zero-amplitude signal from the output of the notch filter.

There are many line-search methods to obtain the optimal value of $k_1$. For the sake of exposition, use the Golden-Section Search method wherein a sequence of intervals is generated, viz., $\{I_1, I_2, \ldots\}$. The rule by which the lengths of successive intervals are generated is that the ratio of any two adjacent intervals is constant, i.e., $$\frac{I_r}{I_{r+1}} = \frac{I_r + 1}{I_{r+2}} = \frac{I_r + 2}{I_{r+3}} = K \quad (14)$$

Figure 5:
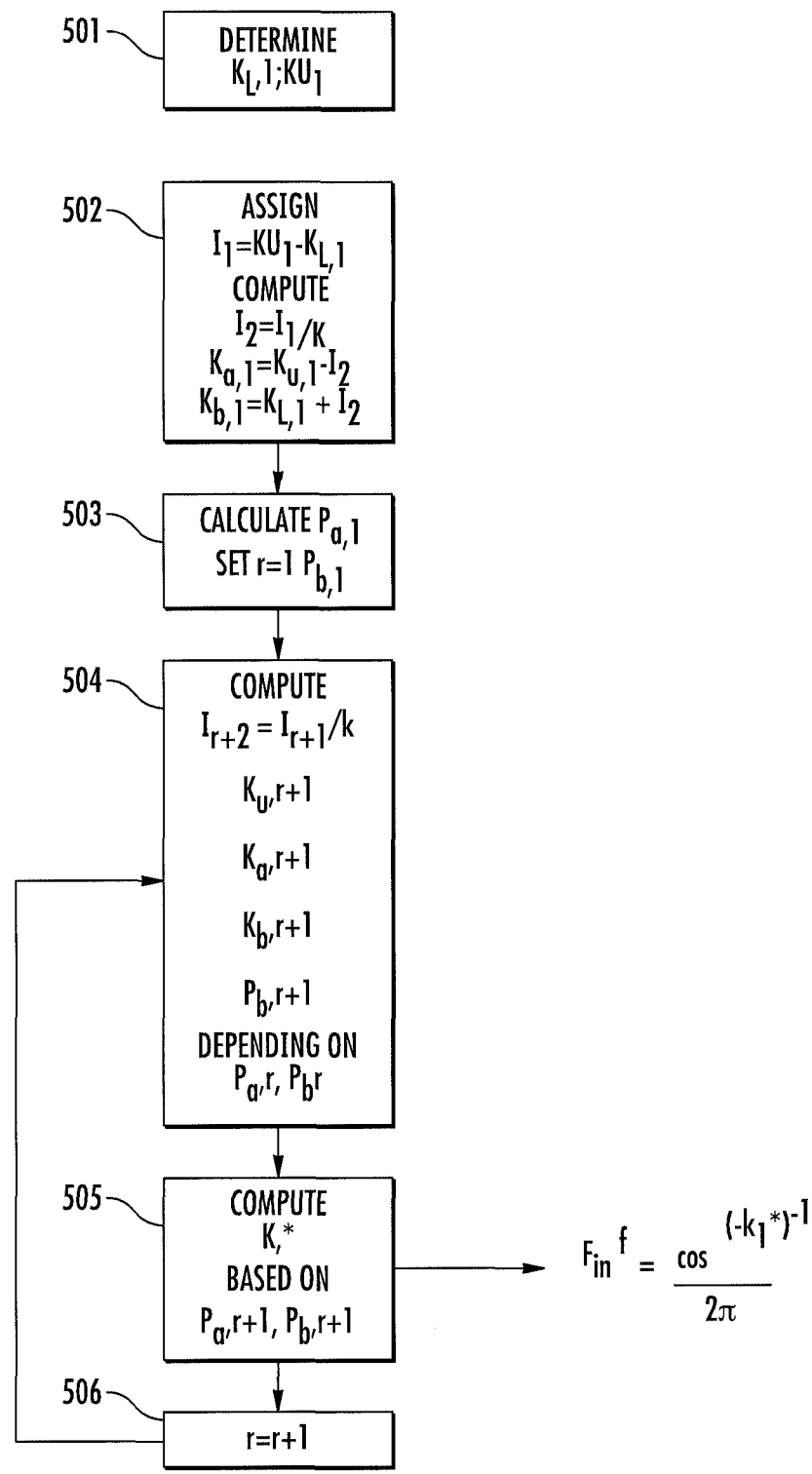
FIG. 5 is a flowchart of a fine frequency estimation method.

The value of K is found to be 1.618034. The algorithm (shown in FIG. 5) starts by choosing two points on either side of the coarse frequency. In our approach we have chosen these two frequencies to be $F_{in}^c(1\pm0.05)$. The corresponding values of $k_1$ viz., $k_{L,1}$ and $k_{U,1}$, denoting the lower and upper initial values of $k_1$ are calculated (item 501). We now describe the Golden-Section Algorithm for finding the optimal value of $k_1$.

Step 1. Assign $I_1 = k_{U,1} - k_{L,1}$ and compute (item 502)

$$I_2 = I_1/K$$

$$k_{a,1} = k_{U,1} - I_2$$

$$k_{b,1} = k_{L,1} + I_2$$

Calculate (item 503) $P_{a,1}$, the power of the signal at the output of the notch filter for $k_1 = k_{a,1}$. Similarly, calculate $P_{b,1}$, the power of the signal at the output of the notch filter for $k_1 = k_{b,1}$. Set r=1.

Step 2. Compute (item 504)

$$I_{r+2} = I_{r+1}/K$$

If $P_{a,r} > P_{b,r}$, then $k_{L,r+1} = k_{a,r}$ $$k_{U,r+1} = k_{U,r}$$

$$k_{a,r+1} = k_{b,r}$$

$$k_{b,r+1} = k_{L,r+1} + I_{r+2}$$

$$P_{a,r+1} = P_{b,r}$$

$P_{b,r+1}$ is evaluated with $k_1 = k_{b,r+1}$.
On the other hand if $P_{a,r} < P_{b,r}$, then $k_{L,r+1} = k_{L,r}$ $$k_{U,r+1} = k_{b,r}$$

$$k_{a,r+1} = k_{U,r+1} - I_{r+2}$$

$$k_{b,r+1} = k_{a,r}$$

$$P_{b,r+1} = P_{a,r}$$

$P_{a,r+1}$ is evaluated with $k_1 = k_{a,r+1}$1.
Step 3. (item 505) If $k_{a,r+1} > k_{b,r+1}$, then
If $P_{a,r+1} > P_{b,r+1}$, compute $$k_1 = 0.5(k_{b,r+1} + k_{U,r+1})$$

If $P_{a,r+1} = P_{b,r+1}$, compute $$k_1^* = 0.5(k_{a,r+1} + k_{b,r+1})$$

If $P_{a,r+1} < P_{b,r+1}$, compute $$k_1^* = 0.5(k_{L,r+1} + k_{a,r+1})$$

and stop. At this point $k_1^*$ is the optimal value of $k_1$.
The fine frequency is now estimated as $$F_{in}^f = \frac{\cos(-k_1^*)^{-1}}{2\pi} \quad (15)$$

Step 4. Set r=r+1 and repeat (item 506) from Step 2 as necessary.

Sinusoidal Signal Prediction

Signal prediction involves the prediction of the present sample based on the past input and output samples. Here we restrict our attention to the prediction using past input samples as it involves finite-impulse response filtering. A straightforward way to predict a sinusoidal signal is to use a set of N samples and obtain the amplitude, frequency, phase and offset using a 4-parameter least-squares fit algorithm, as advanced in the IEEE Standard 1057. Once the parameters are obtained, future samples of the signal can be predicted. While this method is attractive, it is computationally very expensive involving operations with large matrices.

Instead of performing the least-squares fit, the prediction of s'(k) from the samples of the output of the ADC can be performed by linear filtering (see 110 of FIG. 1) as $$s'(k) = \sum_{l=0}^{L} c(l)x(k-l) \quad (16)$$

where L is the length of the filter. The coefficients c(l) are given by $$c(l) = \frac{(L+1)\cos(l\omega) + (S_s - S_c)\cos((l+2)\omega) - 2S_{sc}\sin((l+2)\omega)}{2(S_c S_s - S_{sc}^2)} \quad (17)$$

where $$S_c = \sum_{l=1}^{L+1} \cos^2(l\omega)$$

$$S_s = \sum_{l=1}^{L+1} \sin^2(l\omega)$$

$$S_{sc} = \sum_{l=1}^{L+1} \sin(l\omega)\cos(l\omega)$$

And $\omega$ is set to $2\pi$ times the fine frequency estimate, $F_{in}^f$. The above method of generating coefficients using Eqn (17) is very cumbersome. A simpler sinusoidal signal prediction technique is below.

It is well known that:

$$\sin((n+1)x) + \sin((n-1)x) = 2\cos(x)\sin(nx) \quad (18)$$

Rearranging and changing the time index in Eqn (18), we get $$\sin(nx) = 2\cos(x)\sin((n-1)x) - \sin((n-2)x) \quad (19)$$

We can write the above equation as a recursive equation in $\sin(nx)$ as $$y(n) = 2\cos(x)y(n-1) - y(n-2) \quad (20)$$

We have now created a prediction filter with only two coefficients, viz., $2\cos(x)$ and $-1$ to predict the present value y(n) from y(n−1) and y(n−2). Interestingly, Eqn (20) can be extended to predicting the present value from more distant past values, viz., $$y(n) = 2\cos(Lx)y(n-L) - y(n-2L) \quad (21)$$

Thus, by choosing a suitable value of L, we can create prediction filter 110 as follows.

$$y(n) = \frac{1}{L}\sum_{k=1}^{L}\{2\cos(kx)y(n-k) - y(n-2k)\} \quad (22)$$

Table 1 shows the coefficients of filter 110 characterized by Eqn (22) with L=8. It can be seen that some coefficients are zero. In this case, since $L=2^\mu$, some of the coefficients can be represented by simple shift and add operations. The complexity of the coefficients, thus, involves calculating $\cos(kx)$.

It must be mentioned that transcendental functions like $\sin(x)$ and $\cos(x)$ can be generated very efficiently, for e.g., by simple add-and-shift operations of binary numbers using CORDIC.

It should also be understood that other types of prediction filters can be used.

TABLE 1

Coefficients of the prediction filter for L = 8.

| l | c (l) |
|---|---|
| 1 | 0.178984 |
| 2 | −0.118717 |
| 3 | −0.169988 |
| 4 | −0.374684 |
| 5 | −0.187528 |
| 6 | −0.143832 |
| 7 | 0.160563 |
| 8 | 0.123738 |
| 9 | 0.000000 |
| 10 | −0.125000 |
| 11 | 0.000000 |
| 12 | −0.125000 |
| 13 | 0.000000 |
| 14 | −0.125000 |
| 15 | 0.000000 |
| 16 | −0.125000 |

Generation of Look-Up Table Entries

Figure 6:
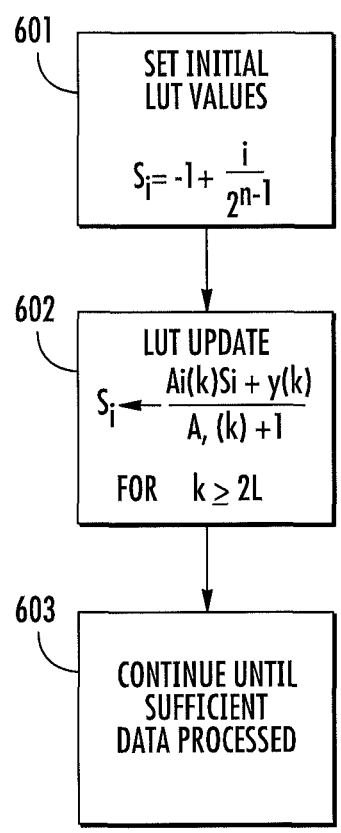
FIG. 6 is a flowchart of an LUT update process.

The intent of constructing an LUT 120 by LUT generation 112 is to produce a set of levels given by $\{s_0, s_1, \ldots, s_{M-1}\}$ such that the entries are optimum from a mean-square sense with respect to the unquantized input signal. The process steps are illustrated in FIG. 6. Without loss of generality, let us assume that the peak-to-peak values of an ideal ADC are ±1. In other words, the ideal quantization values would be uniformly distributed between $[-1, 1-2^{-N+1}]$. Let us assign (item 601) initial values of the LUT as:

$$s_i = -1 + \frac{i}{2^{N-1}} \quad (23)$$

where i=0, 1, ..., $2^N-1$. Let $A_i(k)$ be the number of times a particular level $x(k)=x_i$. Assuming $A_i(k)=0$ for k<2L, the LUT update (item 602) can be written as $$s_i \leftarrow \frac{A_i(k)s_i + y(k)}{A_i(k) + 1} \quad (24)$$

for k≧2L. It must be recalled that y(k) is the predicted value at instant k. After a sufficiently large number of data has been processed (item 603), the LUT 120 is ready for use with the ADC. (In one embodiment herein, $2^{16}$ samples are processed). The data from the ADC 104 is now an address to the LUT 120 and the output of the LUT is the corrected signal.

Simulations for Static Non-Linearities

A simulation was performed in which a signal source of −120 dBc was assumed. Present day commercial signal generators provide spectral purity of about −160 dBc. We present different non-linear conditions in the simulation by subjecting the input signal to different non-linear transfer functions. The frequency of the input signal is chosen such that $$F_{in} = \frac{A}{B} F_s \quad (25)$$

where $F_{in}$ is the input frequency, B is the total number of samples and A is the number of complete cycles of the input signal and $F_s$ is the sampling frequency. It must be mentioned that A and B are mutually prime. The chosen frequency is such that every quantization level is accessed sufficiently large number of times. The input signal from the signal generator is first passed through a non-linear function which is then passed through an N-bit ADC that produces a quantized output. The imperfect ADC can be thought of as a combination of a non-linear function and an ideal quantizer. Our simulations are performed with N=14.

Figure 7:
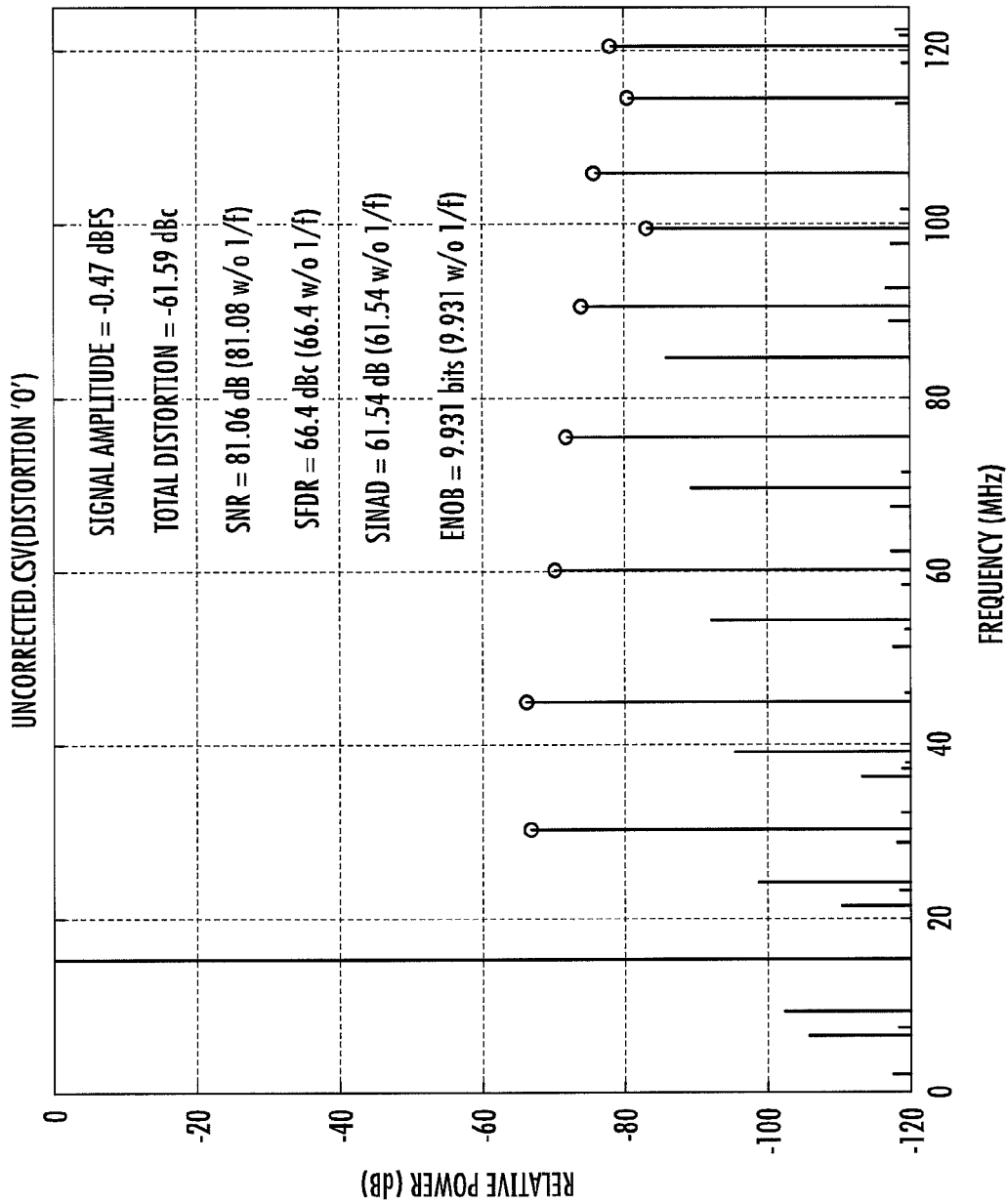
FIG. 7 is a spectrum of the signal before non-linearity correction.
Figure 8:
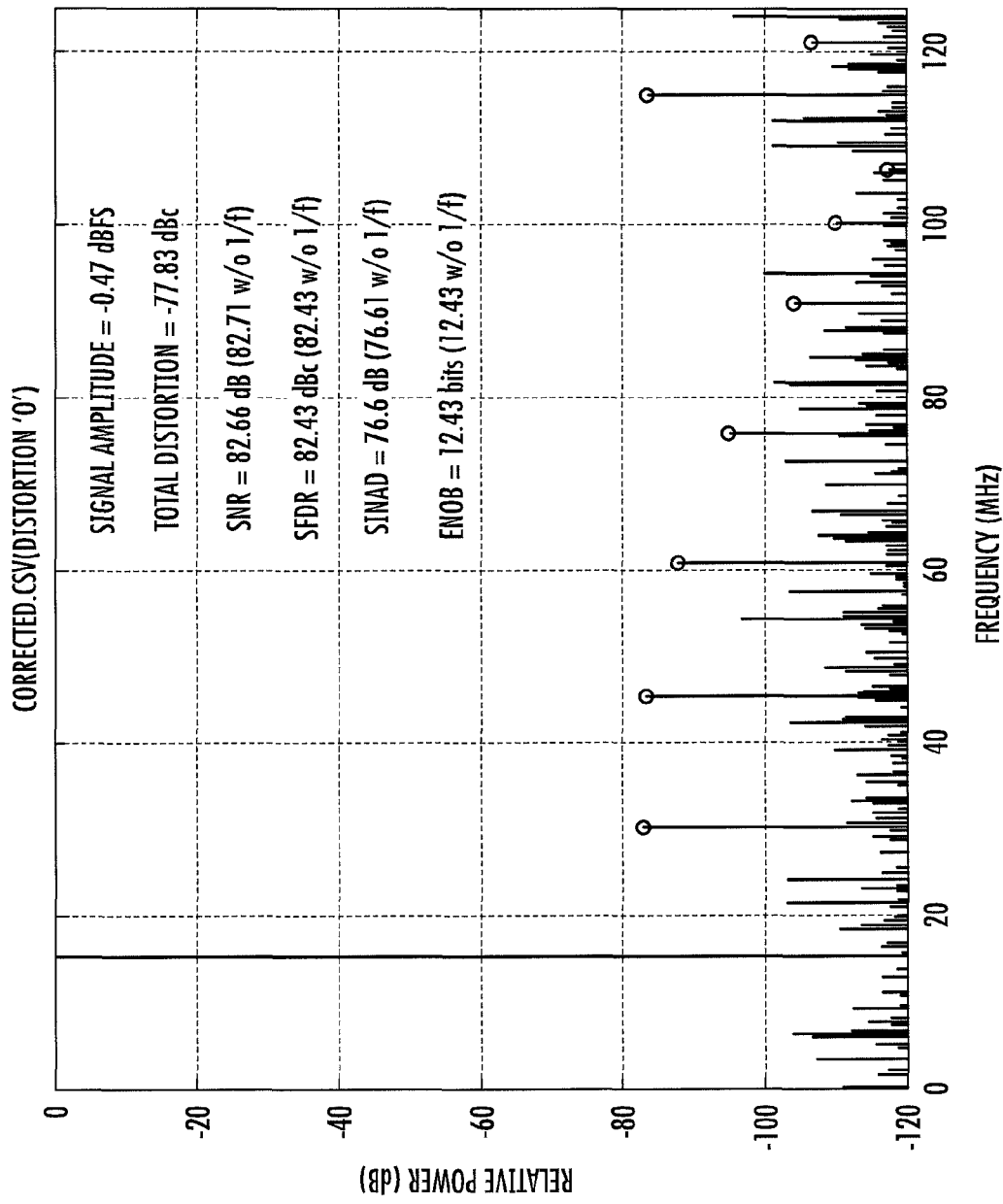
FIG. 8 is a spectrum of the signal after non-linearity correction.

In the first experiment, a calibration signal at 13.695419 MHz is input to the ADC. An LUT is generated following the method presented above. A test signal at 15.064299 MHz is now input to the ADC. FIG. 7 shows the spectrum of the signal with harmonics due to non-linearities. It can be seen from the figure that the SFDR is 66.4 dBc while the SINAD is 61.54 dB. The output of the ADC is passed through the LUT which provides the corrected signal. The spectrum of the corrected signal is shown in FIG. 8. As can be seen from this figure, the SFDR is around 82.43 dBc, around 20 dB improvement. The SINAD is improved to 76.6 dB. As a consequence of the improvement of SINAD, the ENOB has increased significantly.

Figure 9:
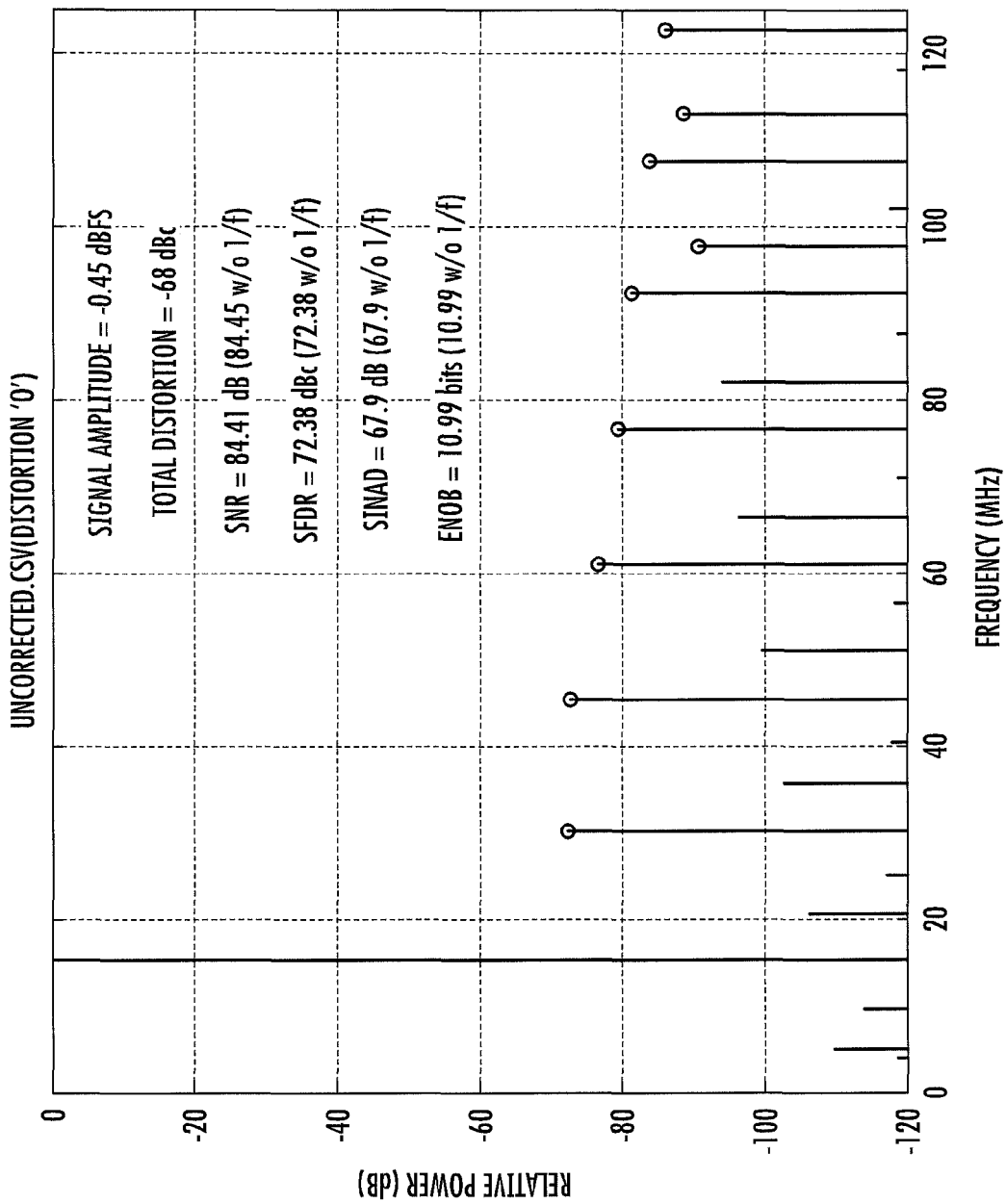
FIG. 9 is a spectrum of the signal before non-linearity correction.
Figure 10:
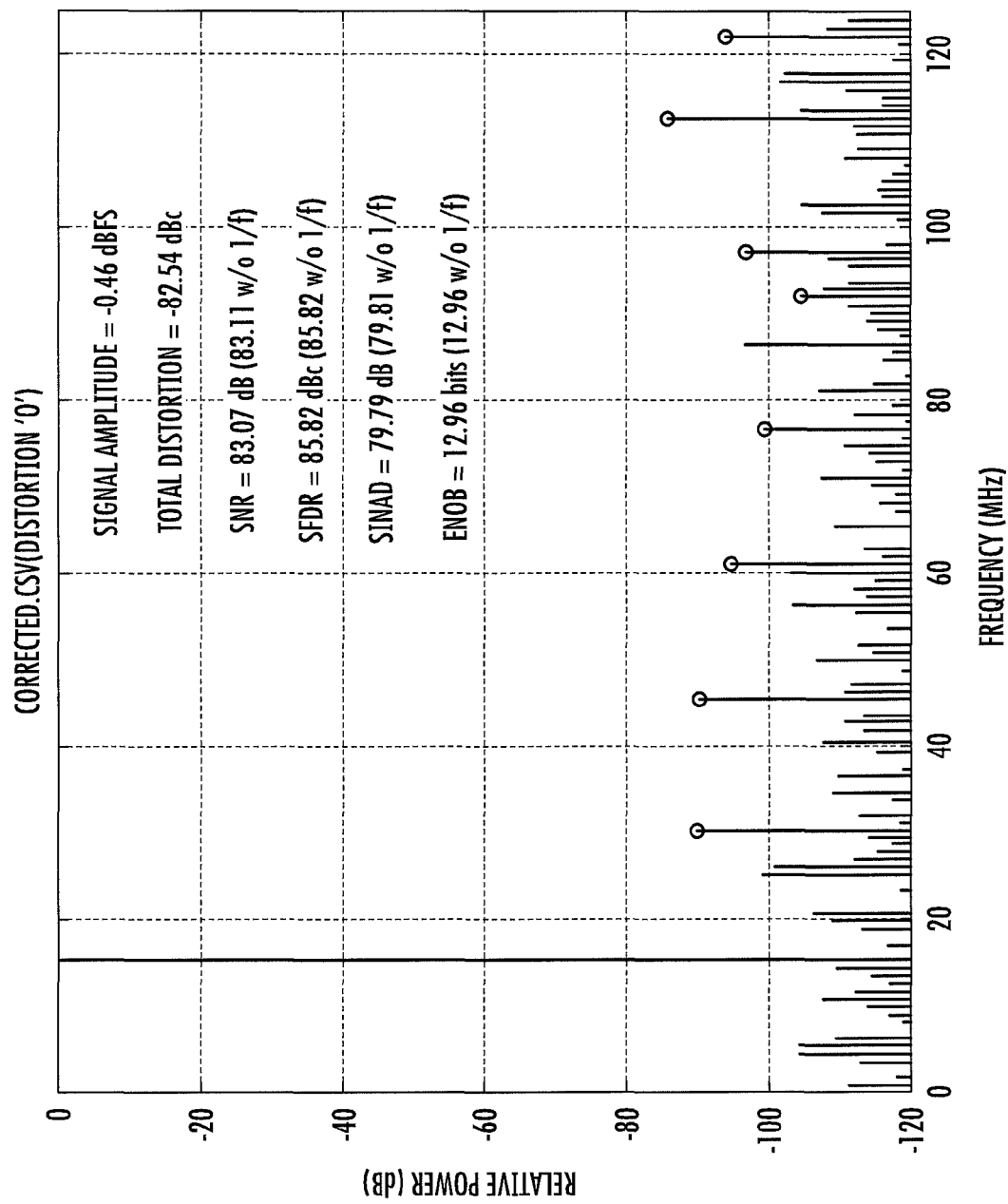
FIG. 10 is a spectrum of the signal after non-linearity correction.

In the second experiment, we develop a non-linear model such that the SFDR of the uncorrected signal from the ADC is better than in the previous experiment. Again, a calibration signal of frequency 13.898194 MHz is input the ADC and an LUT is generated. A test signal at 15.287936 MHz is input to the ADC. As can be seen from FIG. 9, the SFDR of the uncorrected signal is 72.38 dBc while the SINAD is 67.9 dB. The output of the ADC is now passed through the LUT whose output is the corrected signal. The SFDR of the signal from the output of the LUT is improved to 85.82 dBc while the SINAD is increased to approximately 80 dB. This is shown is FIG. 10. It can be noted that the SNR is slightly degraded. This means that in the process of providing optimum quantization levels to the signals, some non-harmonic signals are generated which adds to the SNR. However, a more practical measure of the performance of the ADC is the SINAD which incorporates both the noise and the harmonics. The ENOB in this case has approximately improved by 2 bits.

Figure 11:
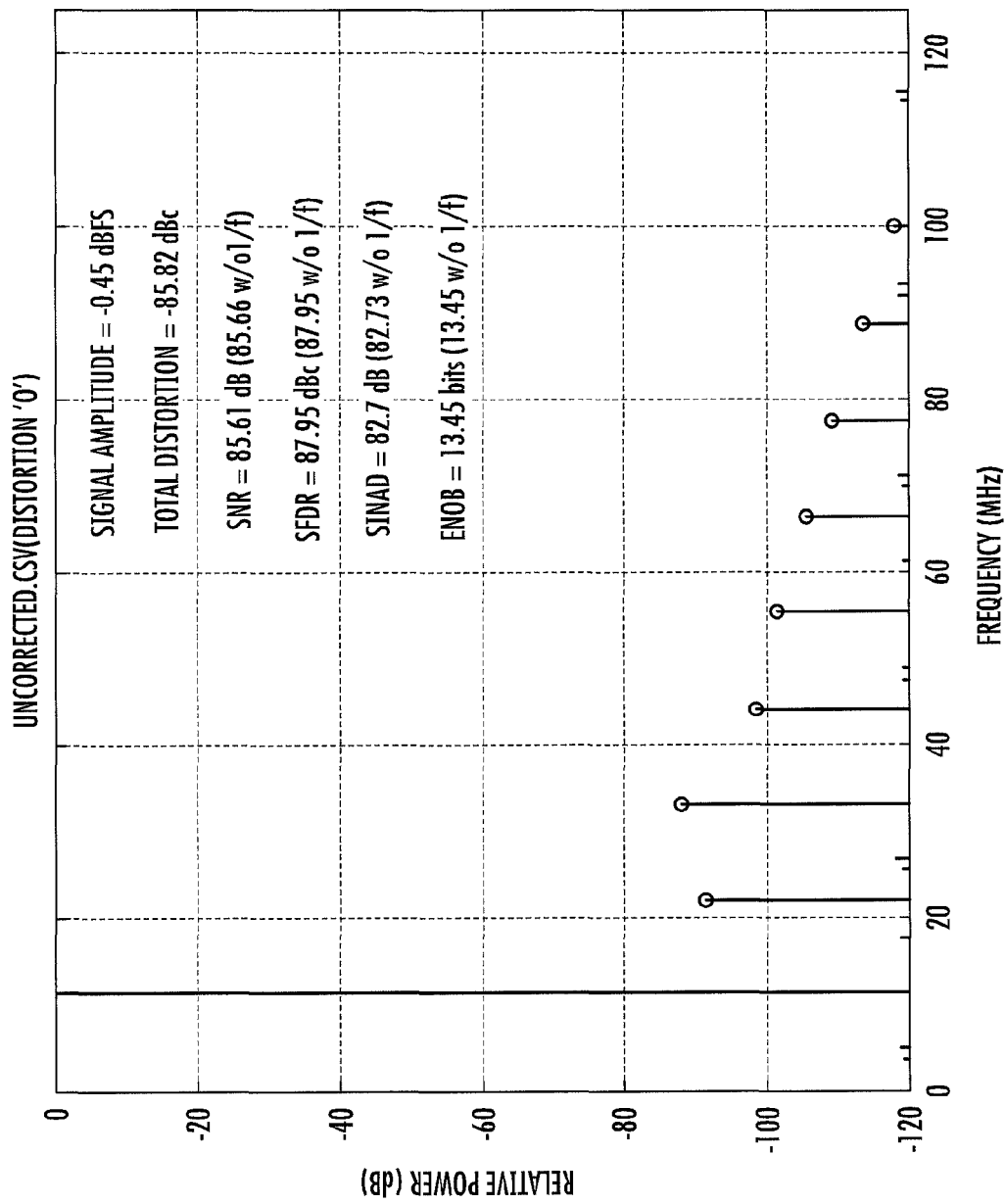
FIG. 11 is a spectrum of the signal before non-linearity correction.
Figure 12:
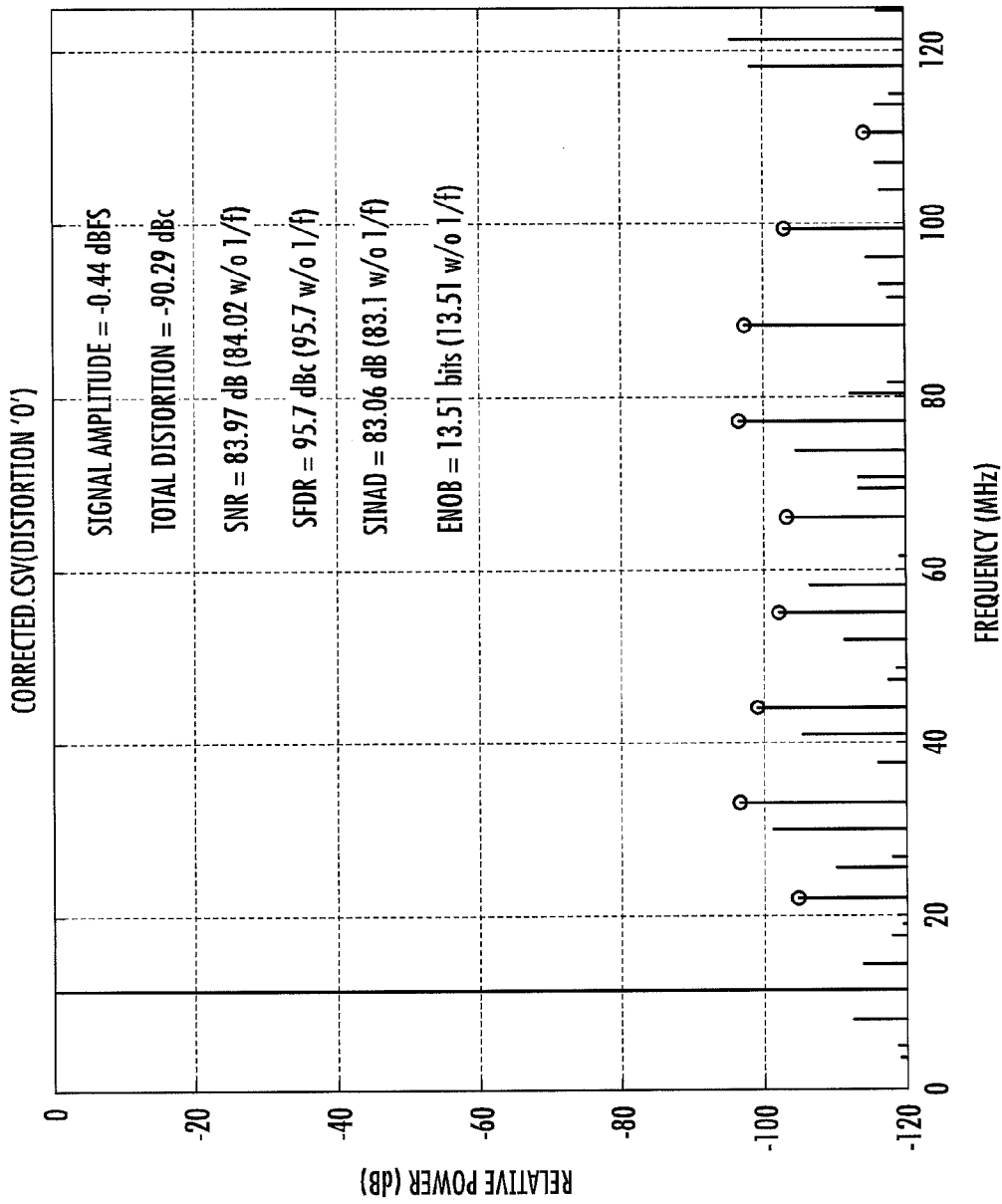
FIG. 12 is a spectrum of the signal after non-linearity correction.

In the next experiment, we simulate an even better ADC with an SFDR of about 87.95 dBc and a SINAD of 82.7 dB. The ENOB is 13.45 bits. The LUT is generated with a calibration signal of frequency 10.008633 MHz and the ADC is tested at 11.009157 MHz. FIG. 11 shows the spectrum before correction while FIG. 12 shows the spectrum of the corrected signal. It can be observed that the SFDR improved by 7 dB while the SINAD and ENOB showed slight improvement.

Figure 13:
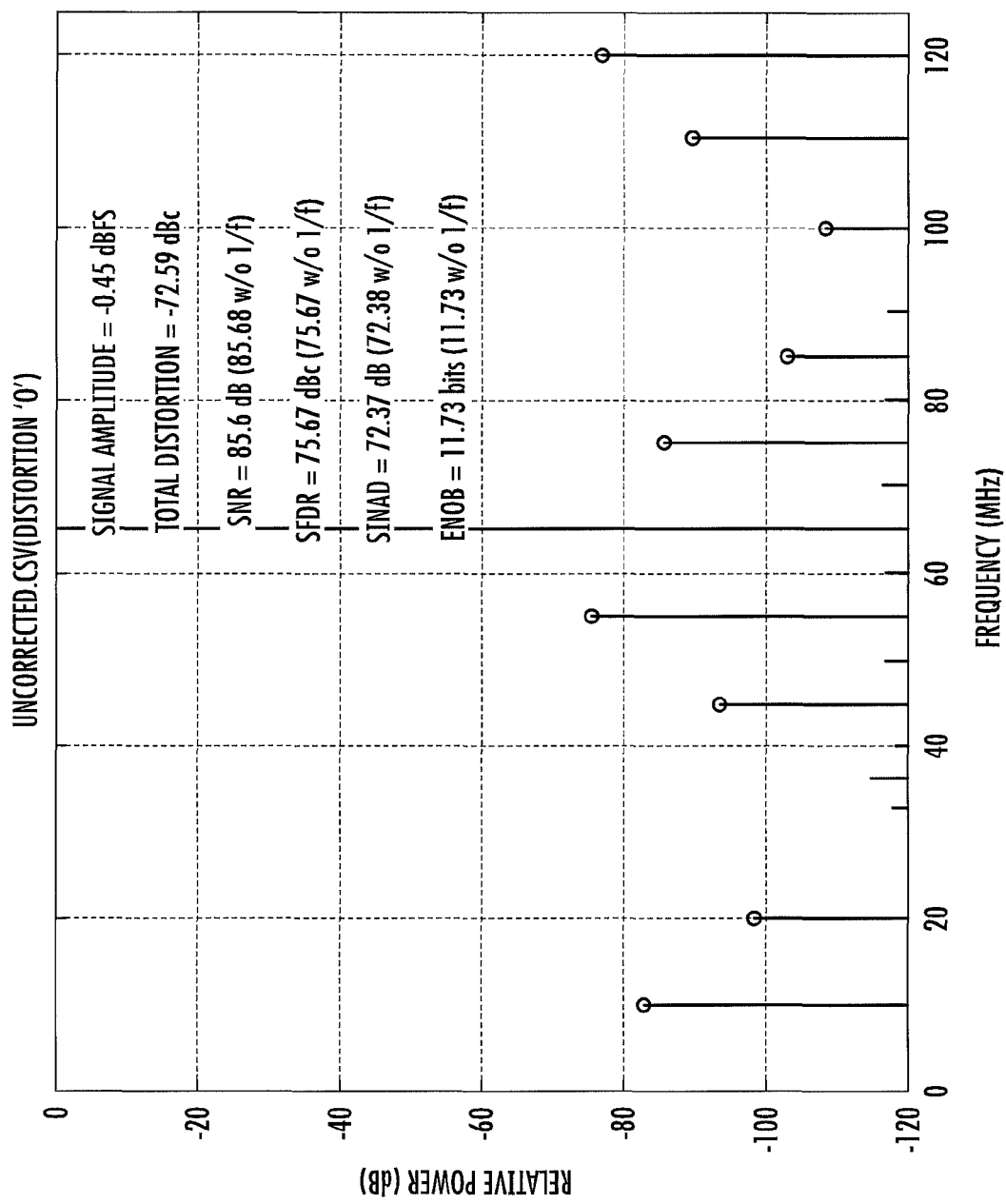
FIG. 13 is a spectrum of the signal before non-linearity correction.
Figure 14:
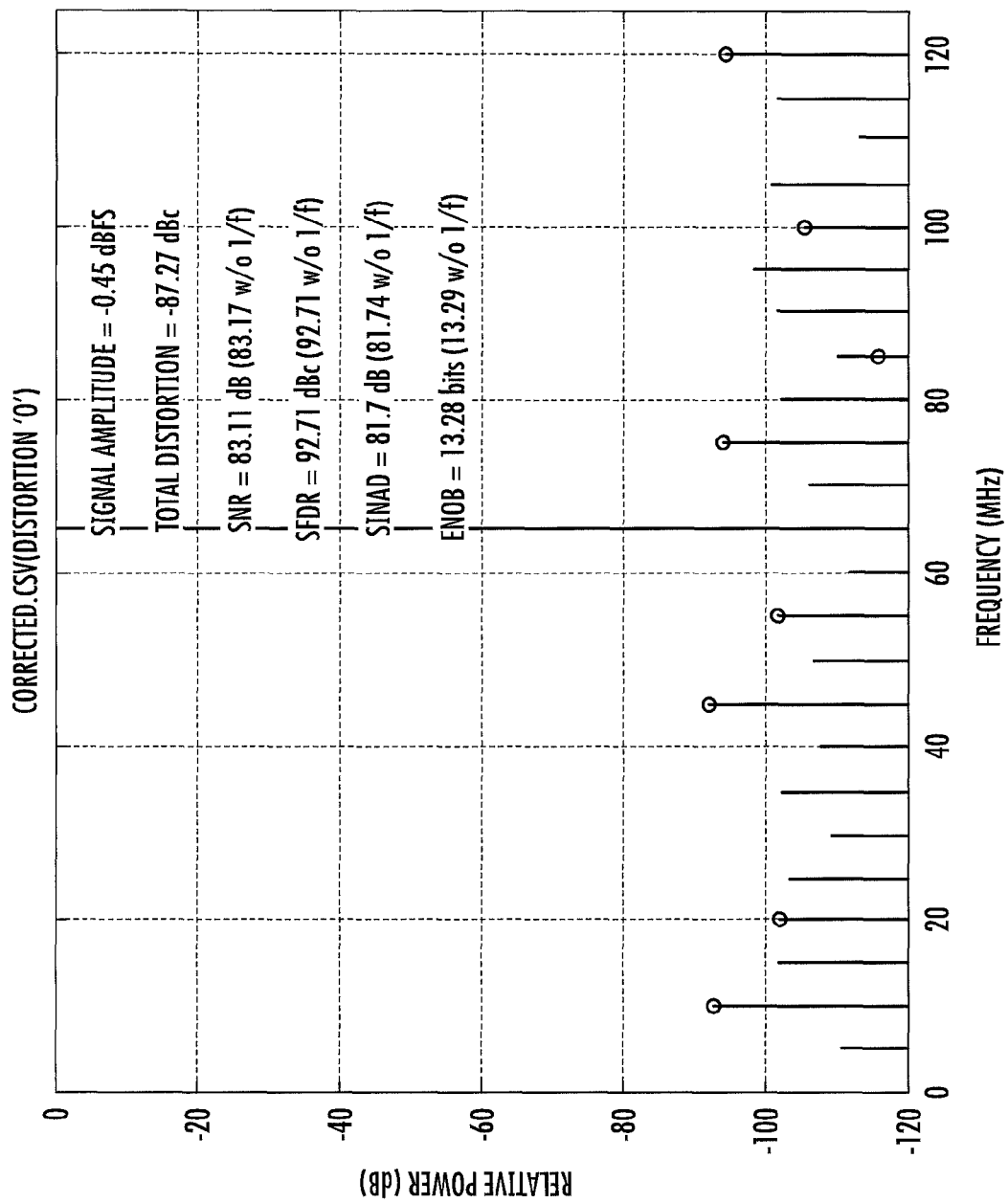
FIG. 14 is a spectrum of the signal after non-linearity correction.

In all the above experiments, the calibration signal and testing signal were in close proximity to each other. In the next experiment, we train the LUT at 18.295825 MHz while testing is performed at 64.99998 MHz. FIG. 13 shows the spectrum before calibration while FIG. 14 shows the spectrum after calibration. The improvement in both SFDR and SINAD can be seen from this figure.

Dynamic Calibration of ADCs

In this section, two methods are provided to carry out dynamic calibration of the non-linear effects of ADCs. In both these methods, multiple calibration frequencies are employed in order to improve the wide-band performance of the converter.

Method 1

Figure 15:
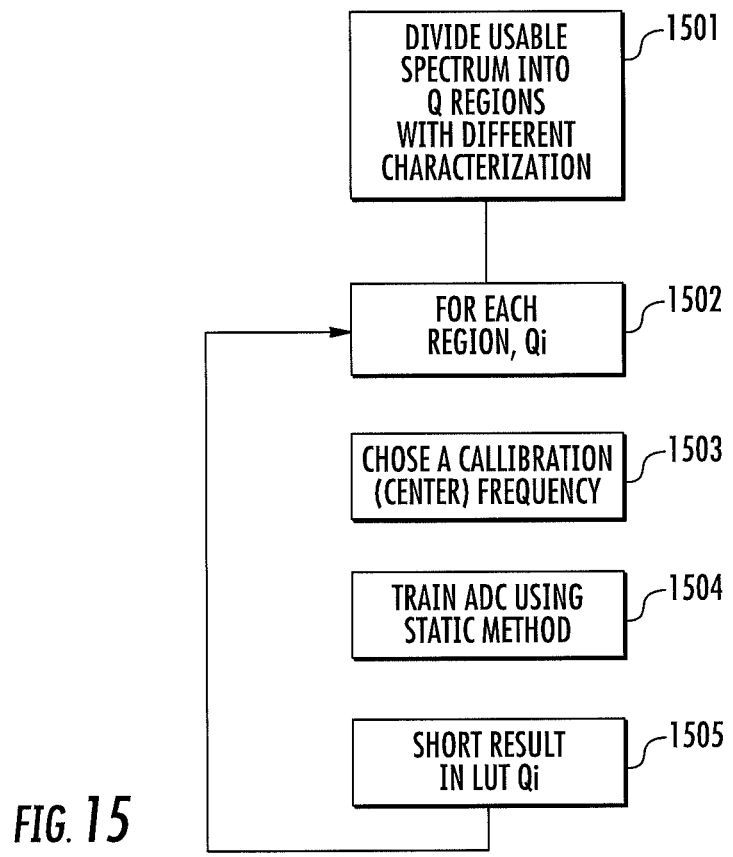
FIG. 15 is a flowchart of a first dynamic calibration method.

In this method (shown in FIG. 15A), the usable frequency spectrum of the ADC is divided (step 1501) into various regions where the non-linear characteristics change considerably. For each of these regions, a center frequency, for example, is chosen as the calibration frequency (step 1502). The ADC is trained (step 1504) at each of these frequencies creating a commensurate number of LUTs.

Figure 16:
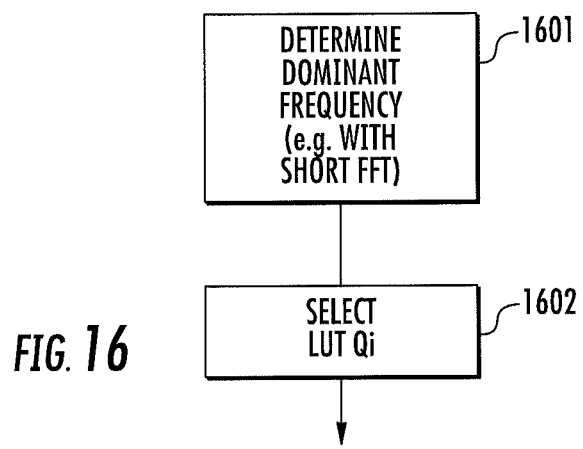
FIG. 16 is a flowchart of how an LUT is selected in a dynamic mode.

After determining the contents of the LUTs and while the ADC is placed in an operating mode (e.g., a non-calibrating mode), the process of FIG. 16 is used. Here, dominant frequency of the input signal is determined (step 1601) by using a short-length FFT. In this simulation, a 16-point FFT is used to obtain the dominant frequency. The bin corresponding to the dominant frequency is used to select the appropriate LUT (step 1602). It must be noted that a 16-point FFT provides 8 bins which should be a sufficient number of frequency regions for all practical purposes. Since the input signal is real, a 16-point FFT can be computed with an 8-point complex FFT.

Figure 17:
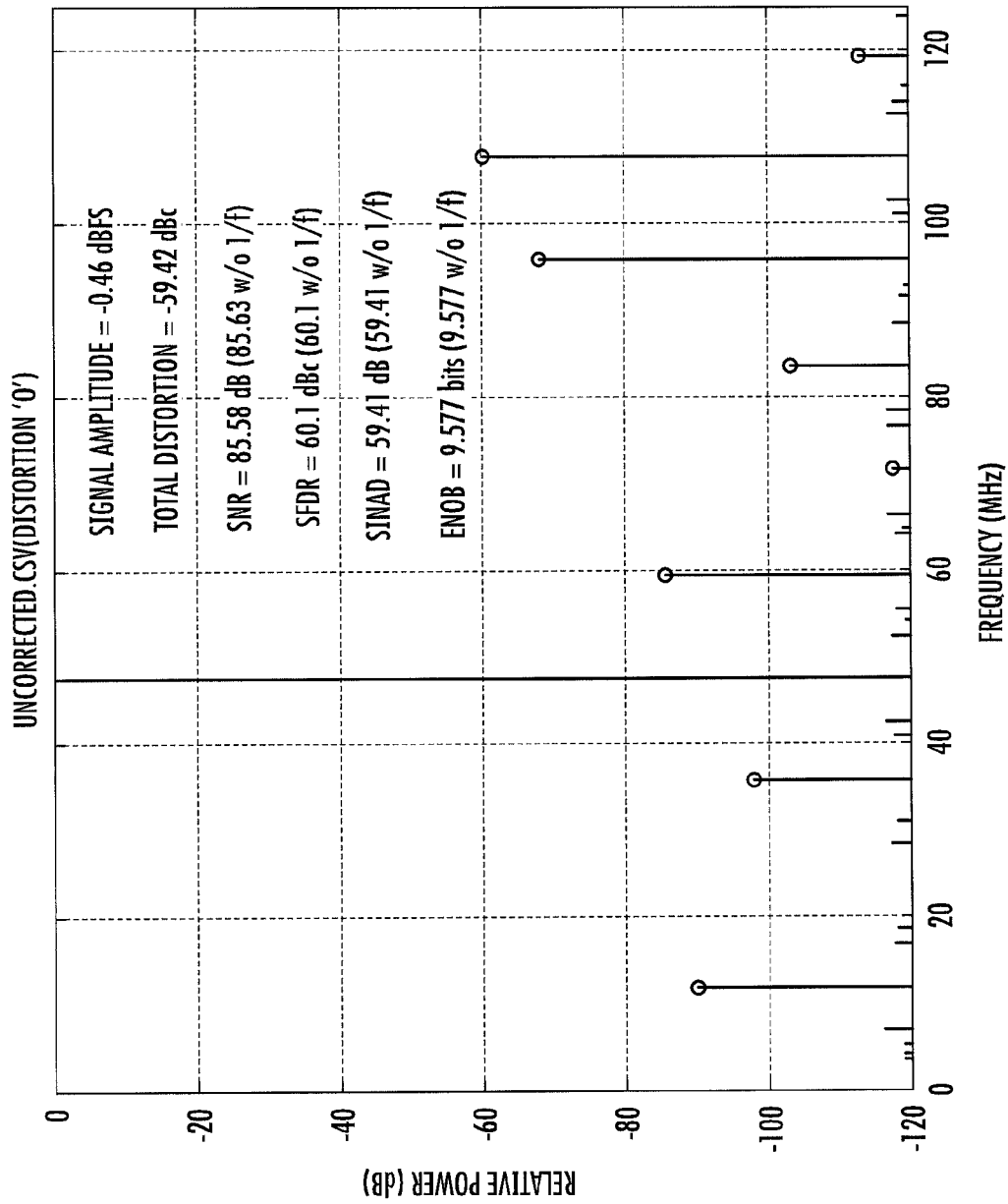
FIG. 17 is a spectrum of the signal before non-linearity correction.
Figure 18:
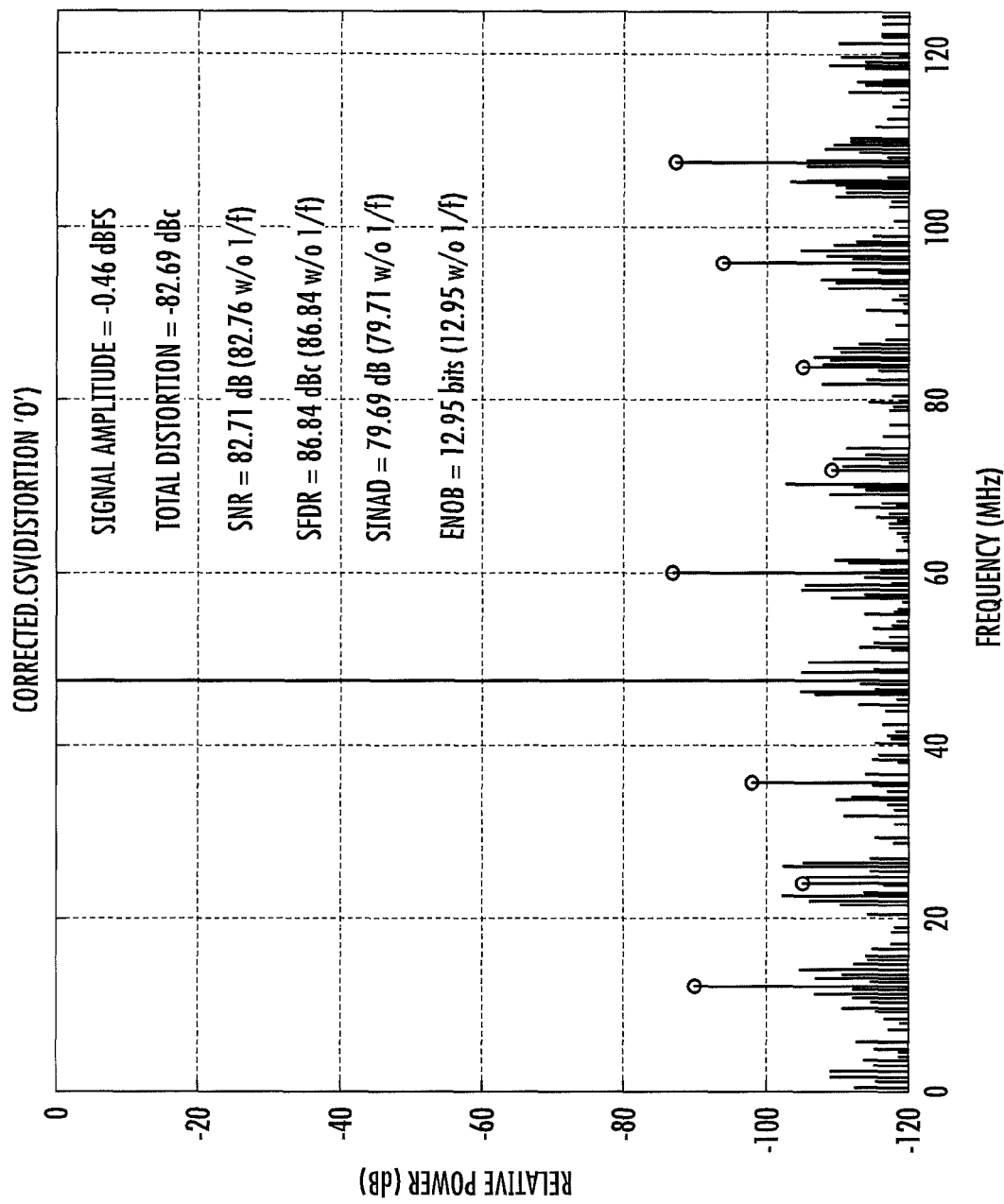
FIG. 18 is a spectrum of the signal after non-linearity correction.

In another experiment, the frequency region between 0 and $F_s/2$ is broken into 5 regions. Five different calibration frequencies between 12.5 MHz and 62.5 MHz are chosen with uniform spacing. For each of the calibration frequency, an LUT is generated using the method mentioned above. Thus a total of 5 LUTs are generated. A test signal of 47.604263 MHz is chosen and passed through the ADC. The spectrum of the uncorrected signal is shown in FIG. 17. The SFDR of this signal is 60.1 dBc while the SINAD is 59.41 dB. Three sets of 16-point FFT are averaged and the bin corresponding to the dominant frequency is identified. The corresponding LUT is chosen for the correction of the ADC. The spectrum of the corrected signal is shown in FIG. 18. As can be seen from the figure, the SFDR improved to 86.84 dBc and the SINAD to 79.69 dB. The ENOB improved by approximately 3 bits.

Figure 19:
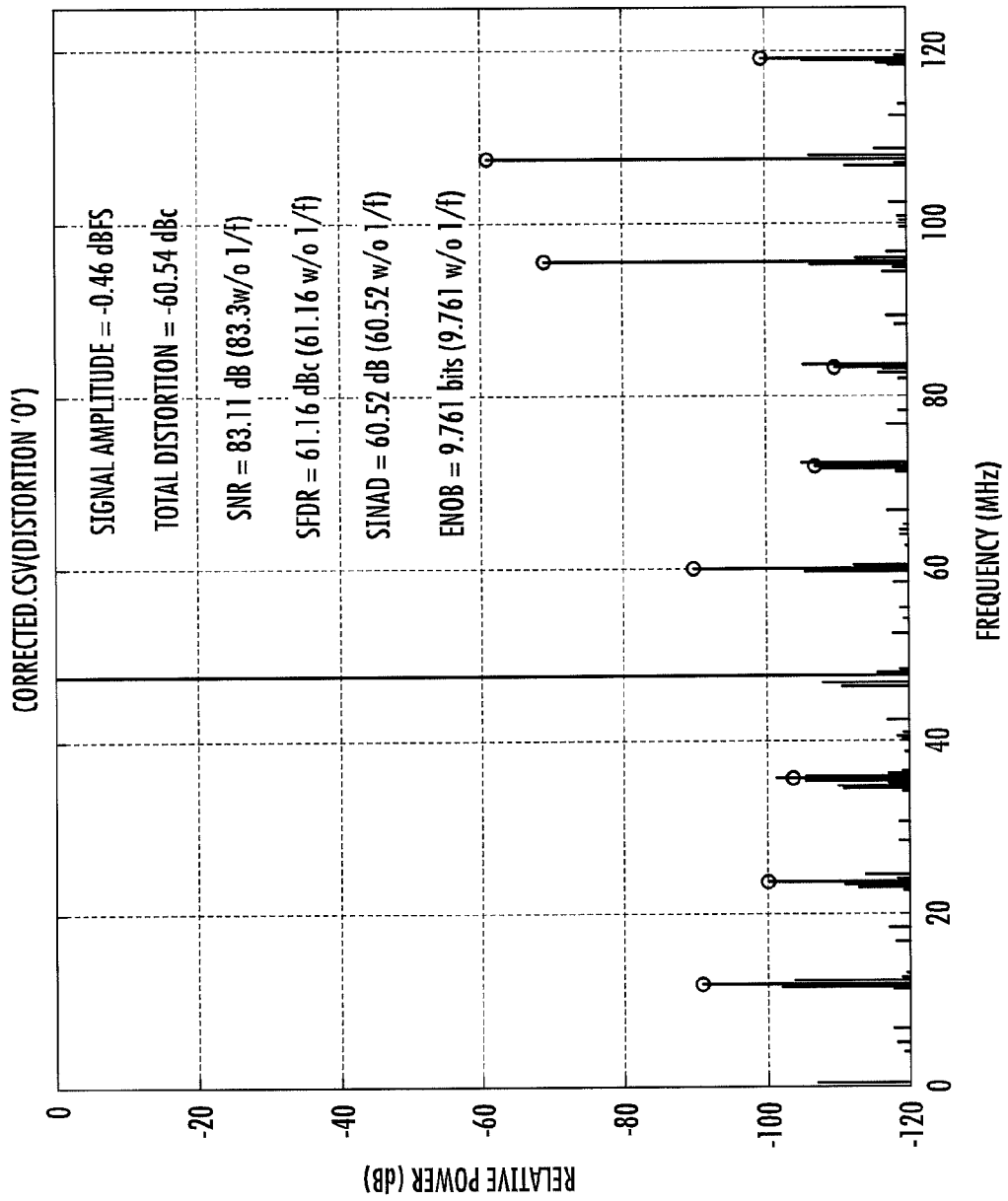
FIG. 19 is a spectrum of the signal after non-linearity correction using the wrong LUT.

In order to demonstrate that it is important to choose the right LUT, based on the dominant frequency, we repeat the above experiment by choosing the wrong LUT. The spectrum of the so-called "corrected" output from the LUT is shown in FIG. 19. As can be seen from the figure, there is no improvement in the performance.

Method 2

Figure 20:
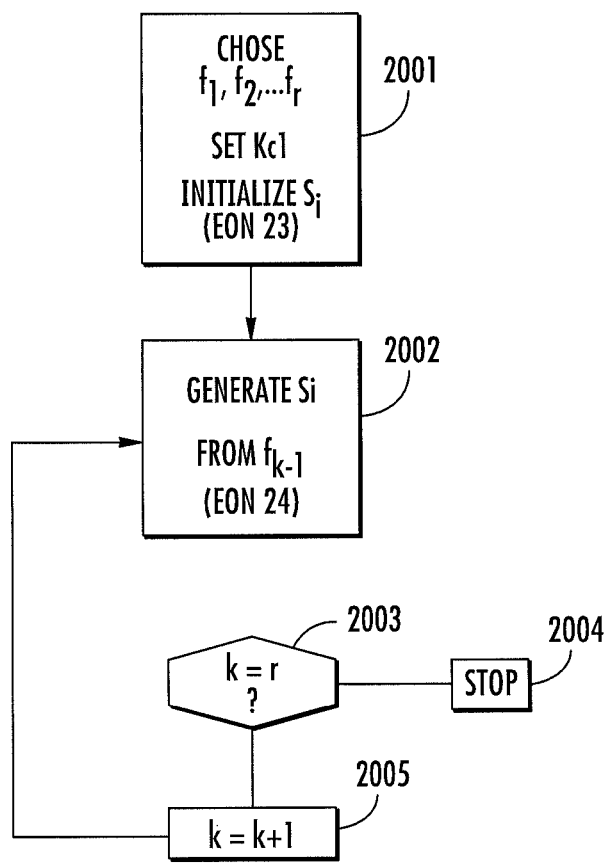
FIG. 20 is a flowchart of an alternate dynamic method.

If the non-linear characteristics do not deviate much from one another, one LUT capturing the average of all the LUT entries for different frequencies can be used. The method entails the following steps as depicted in FIG. 20.

Step 1. Choose $f_1, f_2, \ldots, f_r$ calibration frequencies, set k=1 and initialize $s_i$ using Eqn (23) (item 2001).

Step 2. Generate $s_i$ as shown in Eqn (24) using the $s_i$ from $f_{k-1}$ (item 2002). If k=r, stop (items 2003, 2004).

Step 3. Set k=k+1 (item 2005) and go to Step 2.

Figure 21:
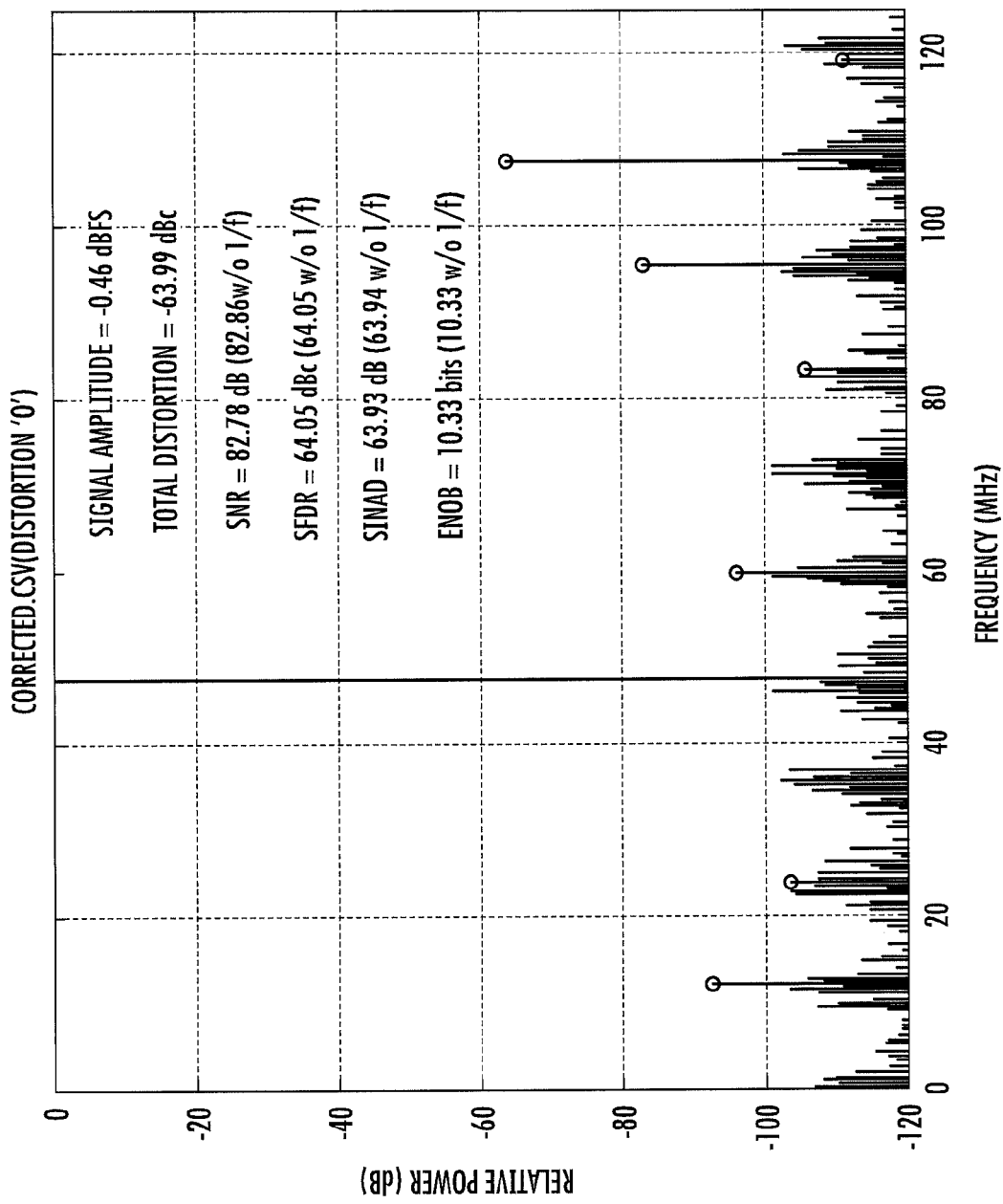
FIG. 21 is a spectrum of the signal after non-linearity correction using a single LUT.

It should be noted that the same LUT is updated for each of the calibrating frequencies. FIG. 21 shows the spectrum of the corrected signal for the same input signal used earlier, viz., 47.604263 MHz. Although the SFDR and SINAD improved by 4 dB and 4.5 dB, respectively, it must be mentioned that the non-linearities in the different frequency regions were considerably different from one another. Consequently, Method 2 would typically be inferior to Method 1.

CONCLUSIONS

This document has shown a method of calibrating the non-linearities of ADCs. We first show how the method is applied to the case when the non-linearities are static, i.e., the characteristics of the non-linearities do not change with frequency. In this method, a calibrating signal from a signal generator is input to the ADC. The frequency of the signal is estimated using a two-step technique wherein the frequency is first estimated coarsely and then using this coarse estimate a fine estimate is performed. After the frequency is estimated, the sinusoidal signal is predicted using a linear predictor. By predicting the sinusoidal signal and the actual signal, a LUT is generated based on optimum quantization levels that minimizes the difference between the actual value and the predicted value in a mean-square sense. Once the LUT is generated, the output of the ADC is treated as an address to the LUT whose output is the calibrated signal.

This technique is extended to the case when the dynamic case where the characteristics of the non-linearities change with frequency. In this case, the usable frequency spectrum of interest is broken into several regions. In each of these regions, a frequency is identified and used as a calibrating signal to generate the corresponding LUT. During the regular operation of the ADC, the bin corresponding to dominant frequency of the signal is identified using a short-length FFT. This bin is used to select the appropriate LUT for operating on the output of the ADC to provide the calibrated output.

If the non-linear characteristics do not deviate much from one another, one LUT capturing the average of all the LUT entries for different frequencies can be used.

What is claimed is:

1. A method for correcting errors in an Analog to Digital Converter (ADC) comprising:
   applying a test signal s(k) to an input of the ADC, thereby producing an ADC output signal x(k) as a discrete time sampled signal;
   estimating a frequency of the test signal from the ADC output signal;
   predicting further samples, s'(k), of the discrete time sampled signal from the ADC output signal; and
   determining a set of ADC correction values from the predicted further samples s'(k),
   wherein estimating a frequency of the test signal further comprises:
   (a) determining a coarse frequency estimate, $F_{in}^c$ from the ADC output signal x(k); and
   (b) determining a fine frequency estimate $F_{in}^f$ from the coarse frequency estimate, and
   wherein determining a fine frequency estimate further comprises:
   (c) filtering the ADC output signal with a notch filter, the notch filter tuned to a notch frequency that depends on the coarse frequency estimate; and
   (d) detecting a power output from the notch filter.

2. The method of claim 1 wherein the step of determining a coarse frequency estimate further comprises:
   counting zero crossings in the ADC output signal, x(k), over a predetermined time interval.

3. The method of claim 1 wherein the notch filter is a second order all pass digital filter.

4. The method of claim 1 wherein filtering the ADC output signal further comprises:
   selecting a set of frequencies depending on the coarse frequency;
   searching for an optimal frequency within the set of frequencies by the further steps of:
   tuning the notch filter to two or more selected frequencies within the set of frequencies; and
   comparing a detected power level of the notch filter at the selected frequencies; and selecting the optimal frequency as the fine frequency estimate.

5. The method of claim 1 wherein the step of predicting further comprises:
filtering selected samples of the ADC output signal, x(k), spaced by a distant sample spacing value, L, with a recursive digital filter.

6. The method of claim 5 wherein the recursive digital filter is a two coefficient, linear prediction filter.

7. The method of claim 1 wherein the correction values are determined by minimizing a mean square error between s(k) and s'(k).

8. The method of claim 1 additionally comprising:
dividing an expected input frequency range into a number of frequency regions;
applying a test signal for each of the frequency regions; and
determining a set of correction values for each of the frequency regions.

9. The method of claim 8 additionally comprising:
averaging the correction values for each of the frequency regions, to determine a single set of correction values.

10. The method of claim 8 additionally comprising the step of:
during an operational mode of the ADC,
detecting a dominant frequency in the ADC input signal, s(k); and
selecting one of the sets of correction values for a frequency region containing the dominant frequency.

11. The method of claim 8 wherein the ADC correction amounts for the number of frequency regions are stored in a corresponding number of Look Up Tables.

12. The method of claim 1 wherein the ADC correction values are stored in a Look Up Table.

13. An apparatus comprising:
a sample and hold circuit, connected to receive a test signal, s(t), and output a discrete time sampled signal s(k);
an Analog to Digital Converter (ADC), connected to receive the discrete time sampled signal s(k) and output an ADC output signal, x(k);
a frequency detector, connected to receive the ADC output signal and to provide a frequency estimate;
a linear prediction filter, connected to receive the frequency estimate and the ADC output signal, to provide a set of predicted signal samples, s'(k); and a Look Up Table (LUT), storing correction values for the ADC, the correction values determined from the predicted signal samples s'(k); and
wherein the frequency detector further comprises:
a zero crossing detector, connected to receive the ADC output signal and to provide a coarse frequency estimate;
a tunable notch filter, tuned to a notch frequency that depences on the coarse frequency estimate; and
a power level detector, connected to the tunable notch filter.

14. The apparatus of claim 13 wherein the linear prediction filter is a recursive linear digital filter that operates on samples of the ADC output signal spaced by number, L, of samples.

15. The apparatus of claim 13 additionally comprising:
a plurality of frequency detectors, for providing a plurality of frequency estimates for a plurality of test signals, each test signal having dominant frequency content in a frequency region;
a plurality of linear prediction filters, connected to receive the plurality of frequency estimates and the ADC output signal; and
a plurality of Look Up Tables, for storing correction values corresponding to corrections to be applied for input signals in corresponding frequency regions.

16. A computer program product comprising:
a computer readable storage medium having stored thereon a set of computer readable instructions embodied in computer readable program code that, when executed by a processor, causes the processor to correct the operation of an Analog to Digital Converter (ADC) by:
receiving samples of an ADC output signal x(k) produced as a discrete time sampled signal in response to a test signal s(k) applied to the ADC;
estimating a frequency of the test signal from the ADC output signal samples;
predicting further samples, s'(k), of the discrete time sampled signal from the ADC output signal; and
determining a set of ADC correction values from the predicted further samples s'(k)
wherein estimating a frequency of the test signal further comprises:
(a) determining a coarse frequency estimate, $F_{in}^c$ from the ADC output signal x(k); and
(b) determining a fine frequency estimate $F_{in}^f$ from the coarse frequency estimate,
wherein determining a fine frequency estimate further comprises:
(c) filtering the ADC output signal with a notch filter, the notch filter tuned to a notch frequency that depends on the coarse frequency estimate; and
(d) detecting a power output from the notch filter,
wherein filtering the ADC output signal further comprises:
(e) selecting a set of frequencies depending on the coarse frequency; and
wherein searching for an optimal frequency within the set of frequencies further comprises:
(f) tuning the notch filter to two or more selected frequencies within the set of frequencies; and
(g) comparing a detected power level of the notch filter at the selected frequencies; and
(h) selecting the optimal frequency as the fine frequency estimate.

\* \* \* \* \*